(12) United States Patent
Jia

(10) Patent No.: US 10,333,559 B2
(45) Date of Patent: Jun. 25, 2019

(54) HYBRID DECODING METHOD AND GIGABIT ETHERNET RECEIVER USING THE SAME

(71) Applicant: ALI CORPORATION, Hsinchu (TW)

(72) Inventor: Yi Jia, Shanghai (CN)

(73) Assignee: ALI CORPORATION, Hsinchu (TW)

(*) Notice: Subject to any disclaimer, the term of this patent is extended or adjusted under 35 U.S.C. 154(b) by 66 days.

(21) Appl. No.: 15/690,390

(22) Filed: Aug. 30, 2017

(65) Prior Publication Data

US 2018/0226997 A1   Aug. 9, 2018

(30) Foreign Application Priority Data

Feb. 8, 2017   (CN) .......................... 2017 1 0069657

(51) Int. Cl.
*H04L 1/00* (2006.01)
*H03M 13/25* (2006.01)
*H03M 13/29* (2006.01)
*H04L 25/03* (2006.01)

(52) U.S. Cl.
CPC ..... *H03M 13/2939* (2013.01); *H03M 13/256* (2013.01); *H04L 1/0045* (2013.01); *H04L 1/0047* (2013.01); *H04L 25/03146* (2013.01)

(58) Field of Classification Search
CPC ............ H03M 13/2939; H03M 13/256; H04L 1/0045
See application file for complete search history.

(56) References Cited

U.S. PATENT DOCUMENTS

| | | | |
|---|---|---|---|
| 2005/0235194 A1* | 10/2005 | Lin .................... | H03M 13/4107 714/796 |
| 2006/0020877 A1* | 1/2006 | Azadet .................. | H03M 13/03 714/796 |
| 2008/0170582 A1* | 7/2008 | Wang ...................... | H04L 25/14 370/412 |
| 2010/0260201 A1* | 10/2010 | Yu ........................ | H04L 25/4923 370/465 |
| 2015/0016319 A1* | 1/2015 | Powell .................. | H04L 12/413 370/282 |

* cited by examiner

*Primary Examiner* — Thien Nguyen
(74) *Attorney, Agent, or Firm* — Li & Cai Intellectual Property (USA) Office

(57) ABSTRACT

A hybrid decoding method and a gigabit Ethernet receiver using the same are provided. The hybrid decoding method and the gigabit Ethernet receiver detect and determine error propagation due to burst interference in a currently used main P-tap parallel decision feedback decoder, decode an Ethernet data stream using a trellis coded modulation (TCM) decoder, and determine a follow-up main decoding algorithm according to the decoded results of the two decoders in the same time interval to effectively prevent error propagation due to burst interference.

12 Claims, 3 Drawing Sheets

HYBRID DECODING METHOD AND GIGABIT ETHERNET RECEIVER USING THE SAME

BACKGROUND

1. Technical Field

The present disclosure generally relates to a hybrid decoding method and a gigabit Ethernet receiver using the same and, more particularly, to a hybrid decoding method and a gigabit Ethernet receiver capable of preventing error propagation due to burst interference.

2. Description of Related Art

The gigabit Ethernet provides a bandwidth of gigabits per second, which is directly upgraded from the conventional Ethernet standard (for example, 10 BASE-T or 100 BASE-T). Therefore, compared to other bandwidth technologies, the gigabit Ethernet has a much lower cost. On the other hand, in the gigabit Ethernet standard (for example, 1000 BASE-T), transmitted data is expressed based on a five-level pulse amplitude modulation scheme (PAM-5) and is coded by trellis coded modulation (TCM). The coded and modulated data is transmitted through a multi-dimensional parallel transmission channel to a designated receiver end.

To implement the gigabit Ethernet, U.S. Pat. No. 7,188,302 (entitled "Parallel decision-feedback decoder and method for joint equalizing and decoding of incoming data stream") filed by Hou-Wei Lin et al discloses a P-tap parallel decision-feedback decoder (PDFD). However, even though Lin et al improves the coding gain, the cost is high and the design of the physical layer (PHY) is difficult because complicated decoding algorithm is used. Moreover, such prior art fails to prevent error propagation due to burst interference.

Accordingly, there exists a need to provide a decoding method capable of preventing error propagation due to burst interference with a simplified and economic design.

SUMMARY

In view of the above, the present disclosure provides a hybrid decoding method and a gigabit Ethernet receiver capable of preventing error propagation due to burst interference.

One embodiment of the present disclosure provides a hybrid decoding method for use in a gigabit Ethernet receiver. The hybrid decoding method includes the steps as follows. An Ethernet data stream is decoded using a P-tap PDFD in a first pre-determined time interval to generate a plurality of first decoded sequences, generate a first statistic value according to a number of abnormal state transitions of the plurality of first decoded sequences, and determine whether the first statistic value is larger than a first threshold value. When the first statistic value is larger than the first threshold value, the Ethernet data stream is decoded using the P-tap PDFD and a trellis coded modulation (TCM) decoder in a second pre-determined time interval after the first pre-determined time interval to generate a plurality of second decoded sequences and a plurality of third decoded sequences, respectively, and generate a second statistic value and a third statistic value according to a number of abnormal state transitions of the plurality of second decoded sequences and a number of abnormal state transitions of the plurality of third decoded sequences, respectively. An output of the P-tap PDFD or the TCM decoder is determined as a decoded result of the Ethernet data stream according to the second statistic value and the third statistic value after the second pre-determined time interval.

One embodiment of the present disclosure provides a gigabit Ethernet receiver. The gigabit Ethernet receiver includes a P-tap PDFD decoder, a TCM decoder and a processing circuit coupled to the P-tap PDFD and the TCM decoder. The gigabit Ethernet receiver decodes an Ethernet data stream using the P-tap PDFD in a first pre-determined time interval to generate a plurality of first decoded sequences, and the processing circuit generates a first statistic value according to a number of abnormal state transitions of the plurality of first decoded sequences and determines whether the first statistic value is larger than a first threshold value. When the first statistic value is larger than the first threshold value, the P-tap PDFD and the TCM decoder decode the Ethernet data stream in a second pre-determined time interval after the first pre-determined time interval to generate a plurality of second decoded sequences and a plurality of third decoded sequences, respectively, and the processing circuit generates a second statistic value and a third statistic value according to a number of abnormal state transitions of the plurality of second decoded sequences and a number of abnormal state transitions of the plurality of third decoded sequences, respectively. The processing circuit determines an output of the P-tap PDFD or the TCM decoder as a decoded result of the Ethernet data stream according to the second statistic value and the third statistic value after the second pre-determined time interval.

In summary, the present disclosure provides a hybrid decoding method and a gigabit Ethernet receiver using the same capable of detecting and determining error propagation due to burst interference in a currently used main decoding algorithm (i.e., a P-tap PDFD), decoding an Ethernet data stream using another decoding algorithm (i.e., a TCM decoder), and determining a follow-up main decoding algorithm according to the decoded results of the two decoders in the same time interval to effectively prevent error propagation due to burst interference.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

The detailed description set forth below in connection with the appended drawings is intended as a description of certain embodiments of the present disclosure, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present disclosure.

More particularly, the present disclosure provides a hybrid decoding method for use in any gigabit Ethernet receiver. In other words, the present disclosure is not limited to any implementation of the gigabit Ethernet receiver, and the person with ordinary skill in the art may make any modifications according to actual demands or applications. Moreover, according to the prior art, the gigabit Ethernet receiver generally includes a P-tap PDFD, which is capable of decoding an Ethernet data stream input into the gigabit Ethernet receiver. Since the P-tap parallel decision feedback decoder is known to the person with ordinary skill in the art, descriptions thereof are not presented herein.

Figure 1:
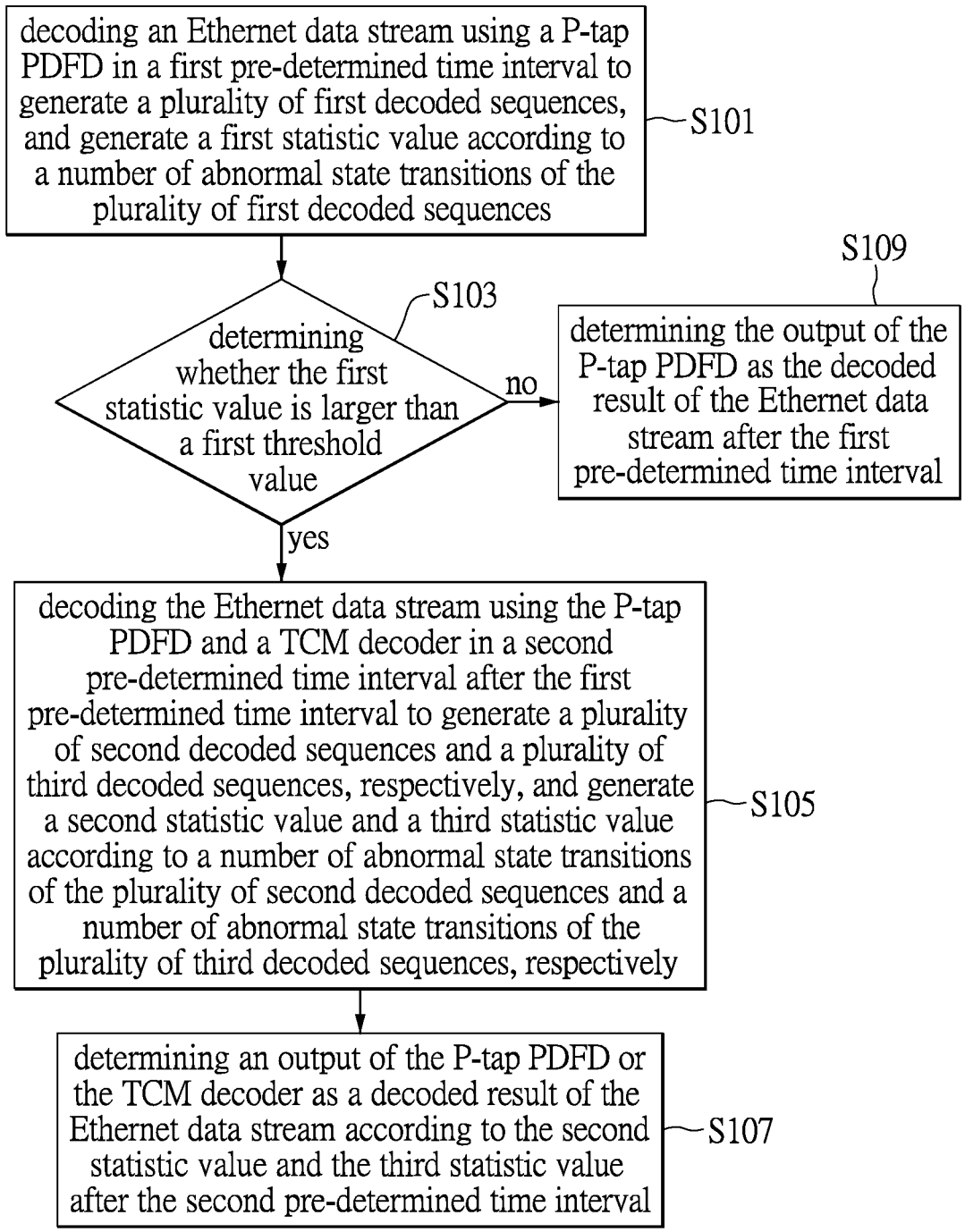
FIG. 1 is a flowchart of a hybrid decoding method according to one embodiment of the present disclosure.

Referring to FIG. 1, FIG. 1 is a flowchart of a hybrid decoding method according to one embodiment of the present disclosure. First, in Step S101, a gigabit Ethernet receiver decodes an Ethernet data stream using a P-tap PDFD in a first pre-determined time interval to generate a plurality of first decoded sequences and generate a first statistic value according to a number of abnormal state transitions of the plurality of first decoded sequences. Then, in Step S103, the gigabit Ethernet receiver determines whether the first statistic value is larger than a first threshold value.

When the first statistic value is larger than the first threshold value, Step S105 is conducted. In Step S105, the gigabit Ethernet receiver decodes the Ethernet data stream using the P-tap PDFD and a TCM decoder in a second pre-determined time interval after the first pre-determined time interval to generate a plurality of second decoded sequences and a plurality of third decoded sequences, respectively. The gigabit Ethernet receiver generates a second statistic value and a third statistic value according to a number of abnormal state transitions of the plurality of second decoded sequences and a number of abnormal state transitions of the plurality of third decoded sequences, respectively. At last, in Step S107, the gigabit Ethernet receiver determines an output of the P-tap PDFD or an output of the TCM decoder as a decoded result of the Ethernet data stream according to the second statistic value and the third statistic value after the second pre-determined time interval.

According to the previous teachings, the person with ordinary skill in the art should understand that one of objects of the present disclosure is to detect whether there is error propagation due to burst interference in a currently used main decoding algorithm (i.e., a P-tap PDFD). When error propagation is determined, the gigabit Ethernet receiver uses a TCM decoder synchronously to decode the Ethernet data stream (i.e., Step S105), and determines a follow-up main decoding algorithm according to the decoded results of the P-tap PDFD and the TCM decoder in the same time interval to effectively prevent error propagation due to burst interference.

In one embodiment, the transmitter end of the gigabit Ethernet uses a convolutional encoder to encode the transmitted data. Therefore, in Step S105, the TCM decoder synchronously used with the P-tap PDFD is, for example, a Viterbi decoder, to which the present disclosure is not limited. However, since the Viterbi decoder is known to the person with ordinary skill in the art, descriptions thereof are not presented herein.

Moreover, according to the trellis diagram of a convolutional encoder, a last digit of a present state decoded sequentially by the receiver end of the gigabit Ethernet has to be equal to an initial digit of a next state. Accordingly, in Step S101 to Step S103, the gigabit Ethernet receiver may detect and determine whether there is error propagation in the currently used main decoding algorithm (i.e., the P-tap PDFD).

For example, in the first pre-determined time interval, if the P-tap PDFD decodes the Ethernet data stream and generates 100 first decoded sequences (for example, SD1_1 to SD1_100), the gigabit Ethernet receiver checks the 100 first decoded sequences SD1_1 to SD1_100 sequentially to determine whether a last digit of a present sequence (i.e., a first decoded sequence SD1_n, where n is a positive integer from 1 to 100, among the 100 first decoded sequences SD1_1 to SD1_100) is equal to an initial digit of a next sequence (i.e., a first decoded sequence SD1_n+1). Thereby, the gigabit Ethernet receiver determines whether there is error propagation due to burst interference in the P-tap PDFD. When the last digit of the first decoded sequence SD1_n is not equal to the initial digit of the next first decoded sequence SD1_n+1, the gigabit Ethernet receiver determines there is an abnormal state transition. Therefore, with the number of abnormal state transitions of the 100 first decoded sequences SD1_1 to SID1_100, the gigabit Ethernet receiver generates a first statistic value (i.e., Na). In other words, in Step S101, the number of abnormal state transitions of the plurality of first decoded sequences indicates the times (i.e., the first statistic value Na) a last digit of a present sequence is not equal to an initial digit of a next sequence in the plurality of first decoded sequences.

Then, by determining whether the first statistic value Na is larger than the first threshold value (for example, THD1), the gigabit Ethernet receiver determines whether there is error propagation due to burst interference in the currently used P-tap PDFD. For example, if the first statistic value Na is 50, there are 50 times of abnormal state transitions in the 100 first decoded sequences SD1_1 to SD1_100 sequentially decoded by the P-tap PDFD. In the previous example, the number of abnormal state transitions (i.e., 50) is much larger than the acceptable threshold value (for example, the first threshold value THD1 is set to be 10). The gigabit Ethernet receiver determines that there is error propagation due to burst interference in the currently used main decoding algorithm (i.e., the P-tap PDFD). Therefore, in the second pre-determined time interval after the first pre-determined time interval, the gigabit Ethernet receiver uses another decoding algorithm (i.e., the TCM decoder) synchronously to decode the Ethernet data stream.

It should be noted that the present disclosure is not limited to the implementations of the first pre-determined time interval, the first threshold value and these first decoded sequences, and the person with ordinary skill in the art may make any modifications according to actual demands or applications. Moreover, it should be understood that, at the initial stage, the gigabit Ethernet receiver only uses the P-tap PDFD to decode the Ethernet data stream. Therefore, in the first pre-determined time interval, the gigabit Ethernet receiver only uses the output of the P-tap PDFD as the current decoded result of the Ethernet data stream. Similarly, it should be understood that, when the number (i.e., first statistic value Na) of abnormal state transitions in the first decoded sequences is not larger than the first threshold value THD1, the gigabit Ethernet receiver determines that there is no error propagation due to burst interference in the currently used decoding algorithm or that there is error propagation under control. Therefore, the hybrid decoding method in the present disclosure provides the Step S109. In Step S109, the gigabit Ethernet receiver determines the output of the P-tap PDFD as the decoded result of the Ethernet data stream after the first pre-determined time interval.

On the other hand, in the second pre-determined time interval, if the P-tap PDFD decodes the Ethernet data stream and generates 100 second decoded sequences (for example, SD2_1 to SD2_100), the TCM decoder synchronously decodes the Ethernet data stream and also generates 100 third decoded sequences (for example, SD3_1 to SD3_100). Then, the gigabit Ethernet receiver sequentially checks the 100 second decoded sequences SD2_1 to SD2_100 and the 100 third decoded sequences SD3_1 to SD3_100, respectively, to determine whether a last digit of a present sequence (i.e., a second or third decoded sequence SDi_n, where i is 2 or 3 and n is a positive integer from 1 to 100, among the second or third decoded sequences SDi_1 to SDi_100) is equal to an initial digit of a next sequence (i.e., a second or third decoded sequence SDi_n+1). Therefore, with the number of abnormal state transitions of the 100 second decoded sequences SD2_1 to SD2_100 and the number of abnormal state transitions of the 100 third decoded sequences SD3_1 to SD3_100, respectively, the gigabit Ethernet receiver generates a second statistic value (i.e., Np) and a third statistic value (i.e., Nv). In other words, in Step S105, the number of abnormal state transitions of the plurality of second decoded sequences indicates the times (i.e., the second statistic value Np) a last digit of a present sequence is not equal to an initial digit of a next sequence in the plurality of second decoded sequences. Moreover, in Step S105, the number of abnormal state transitions of the plurality of third decoded sequences indicates the times (i.e., the third statistic value Nv) a last digit of a present sequence is not equal to an initial digit of a next sequence in the plurality of third decoded sequences.

Figure 2:
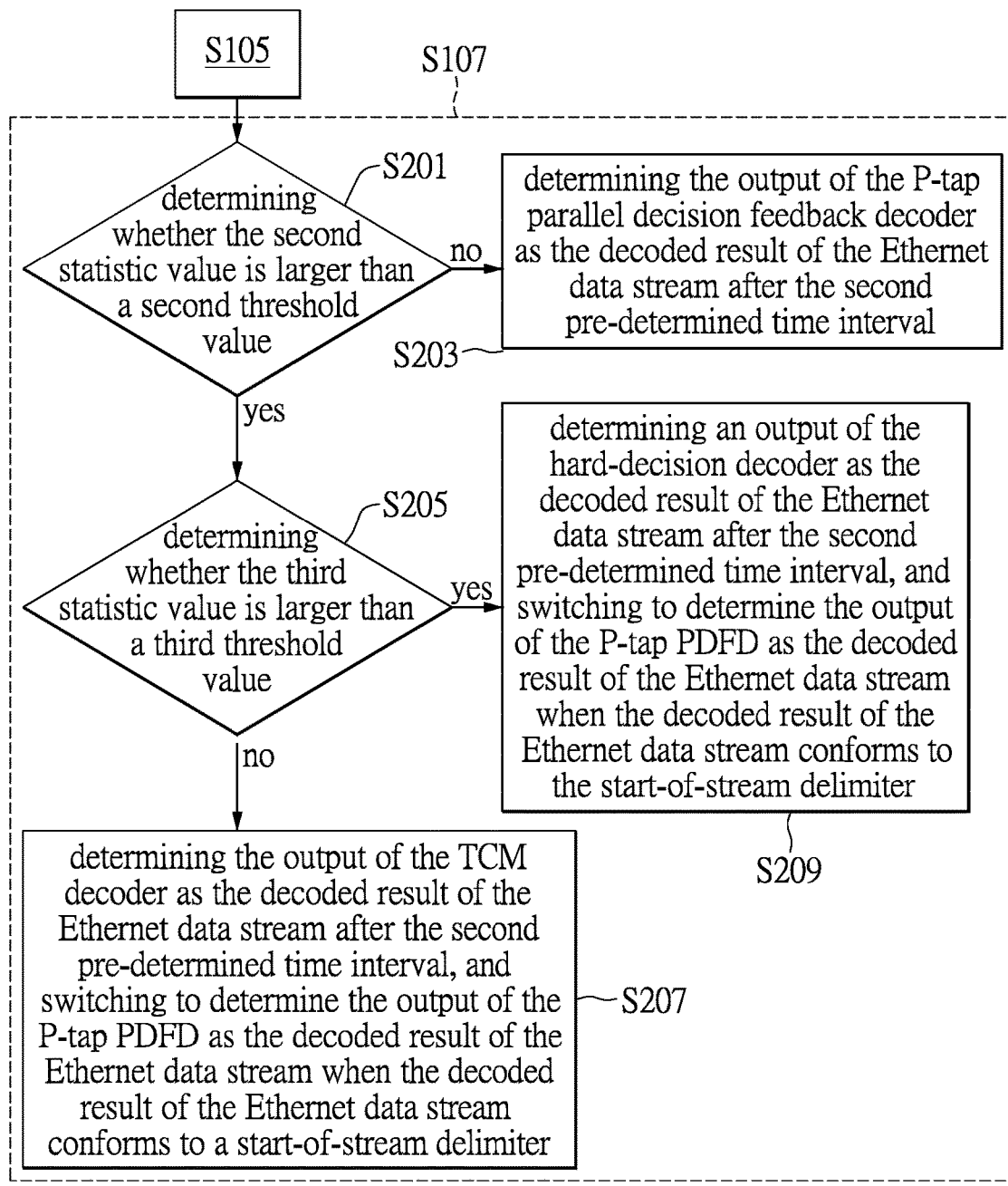
FIG. 2 is a flowchart of determining an output of a P-tap parallel decision feedback decoder or a TCM decoder as a decoded result of an Ethernet data stream according to a second statistic value and a third statistic value in a hybrid decoding method in FIG. 1.

Moreover, the Viterbi decoder generally provides a hard-decision mode. Therefore, in Step S105, the gigabit Ethernet receiver may use a hard-decision decoder to decode the Ethernet data stream. Then, detailed descriptions of Step S107 will be presented herein. The present disclosure further provides an implementation of Step S107. Referring to FIG. 2, FIG. 2 is a flowchart of determining an output of a P-tap PDFD or a TCM decoder as a decoded result of an Ethernet data stream according to a second statistic value and a third statistic value in a hybrid decoding method in FIG. 1. Some elements in FIG. 2 identical to those in FIG. 1 are labeled with identical symbols, and descriptions thereof are thus not presented herein.

Referring to FIG. 1 and FIG. 2, Step S107 further includes Step S201 to Step S209. First, in Step S201, the gigabit Ethernet receiver determines whether the second statistic value Np is larger than a second threshold value. When the second statistic value Np is not larger than the second threshold value, Step S203 is conducted. In Step S203, the gigabit Ethernet receiver determines the output of the P-tap PDFD as the decoded result of the Ethernet data stream after the second pre-determined time interval. Moreover, when the second statistic value Np is larger than the second threshold value, Step S205 is conducted. In one embodiment, the second threshold value is equal to the third statistic value Nv plus a pre-determined value. The pre-determined value is adjustable and is preferably larger than or equal to zero.

In Step S205, the gigabit Ethernet receiver advances to determine whether the third statistic value Nv is larger than a third threshold value. When the third statistic value Nv is not larger than the third threshold value, Step S207 is conducted. In Step S207, the gigabit Ethernet receiver determines the output of the trellis coded modulation decoder as the decoded result of the Ethernet data stream after the second pre-determined time interval, and switches to determine the output of the P-tap PDFD as the decoded result of the Ethernet data stream when the decoded result of the Ethernet data stream conforms to a start-of-stream delimiter (SSD). Then, the steps in FIG. 1 are repeated.

According to the prior art, the P-tap PDFD, compared to the TCM decoder, can estimate inter-symbol interference (ISI) more precisely. However, the TCM decoder (for example, the Viterbi decoder) in the present disclosure uses a hard-decision mode to prevent error propagation due to burst interference in the TCM decoder. In other words, when there is no error propagation due to burst interference, the second statistic value Np does not need to be larger than the third statistic value Nv. However, considering actual working conditions, a pre-determined value (for example, Δ) is added to the third statistic value Nv in one embodiment of the present disclosure to determine the second threshold value (i.e., THD2=Nv+Δ). Therefore, when the second statistic value Np is not larger than the second threshold value THD2, the gigabit Ethernet receiver determines that there is no error propagation due to burst interference in the currently used main decoding algorithm (i.e., the P-tap PDFD). Accordingly, the gigabit Ethernet receiver determines the output of the P-tap PDFD as the decoded result of the Ethernet data stream after the second pre-determined time interval (i.e., Step S203).

On the other hand, when the second statistic value Np is larger than the second threshold value THD2, the gigabit Ethernet receiver determines that there is error propagation due to burst interference in the currently used main decoding algorithm (i.e., the P-tap PDFD). However, since the gigabit Ethernet receiver fails to make sure whether the output of the TCM decoder is reliable, the gigabit Ethernet receiver further compares the third statistic value Nv with the third threshold value (i.e., THD3) to determine whether the output of the TCM decoder is reliable. For example, if the third statistic value Nv is 10, indicating the number of abnormal state transitions in the 100 third decoded sequences SD3_1 to SD3_100 sequentially decoded by the TCM decoder is 10, the number of abnormal state transitions is much lower than the reliable threshold value (for example, the third threshold value THD3 is set to be 15). Therefore, when the third statistic value Nv is not larger than the third threshold value THD3, the gigabit Ethernet receiver determines the output of the TCM decoder is reliable, and the gigabit Ethernet receiver switches to use the TCM decoder as a main decoding algorithm (i.e., determining the output of the TCM decoder as the decoded result of the Ethernet data stream) after the second pre-determined time interval. It should be understood that, after overcoming error propagation using the TCM decoder, the gigabit Ethernet receiver switches back to use the P-tap PDFD with better ISI estimation to serve as the main decoding algorithm and repeat Step S101 in FIG. 1. Therefore, in Step S207, the gigabit Ethernet receiver switches back to determine the output of the P-tap PDFD as the decoded result of the Ethernet data stream when the decoded result of the Ethernet data stream conforms to a start-of-stream delimiter (SSD). Then, the steps in FIG. 1 are repeated.

It should be noted that, the present disclosure is not limited to the implementations of the second pre-determined time interval, the pre-determined value, the third threshold value, the second and third decoded sequences, and the person with ordinary skill in the art may make any modifications according to actual demands or applications. Moreover, it should be understood that, before using the TCM decoder as the main decoding algorithm, the P-tap PDFD is the pre-determined main decoding algorithm in the gigabit Ethernet receiver. Therefore, in the second pre-determined time interval, the gigabit Ethernet receiver still determines the output of the P-tap PDFD as the current decoded result of the Ethernet data stream.

On the other hand, when the third statistic value Nv is larger than the third threshold value THD3, the gigabit Ethernet receiver determines that the output of the TCM decoder is unreliable. However, the output of the P-tap PDFD has more errors than the output of the TCM decoder when the second statistic value Np is larger than the second threshold value. Therefore, Step S209 of the hybrid decoding method in FIG. 2 is conducted. In Step S209, the gigabit Ethernet receiver determines an output of the hard-decision decoder as the decoded result of the Ethernet data stream after the second pre-determined time interval, and switches to determine the output of the P-tap PDFD as the decoded result of the Ethernet data stream when the decoded result of the Ethernet data stream conforms to a start-of-stream delimiter (SSD). Then, the steps in FIG. 1 are repeated.

Moreover, for the gigabit Ethernet standard (for example, 1000 BASE-T), the signal sample transmitted on the each twist pair in the transmission channel transmission channel may include an idle, a start-of-stream delimiter (SSD), a data and an end-of-stream delimiter (ESD). However, as previously stated, except the data, the others are generally expressed based on a three-level pulse amplitude modulation scheme (PAM-3). Therefore, to simplify the operation of the TCM decoder, in Step S207 where the output of the TCM decoder is determined as the decoded result of the Ethernet data stream, the gigabit Ethernet receiver further determines whether the decoded result of the Ethernet data stream conforms to an end-of-stream delimiter or an idle. When the decoded result of the Ethernet data stream conforms to the end-of-stream delimiter or the idle, the gigabit Ethernet receiver determines the output of the hard-decision decoder as the decoded result of the Ethernet data stream. Similarly, it should be understood that, when the decoded result of the Ethernet data stream does not conform to the end-of-stream delimiter or the idle, the gigabit Ethernet receiver still uses the output of the TCM decoder as the decoded result of the Ethernet data stream.

Figure 3:
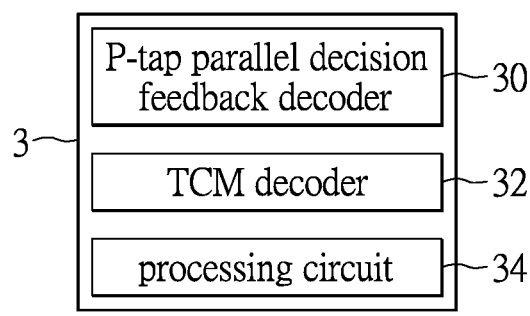
FIG. 3 is a schematic diagram of a gigabit Ethernet receiver according to one embodiment of the present disclosure.

To further describe the operation of the hybrid decoding method, the present disclosure advances to provide an implementation of the hybrid decoding method. Referring to FIG. 3, FIG. 3 is a schematic diagram of a gigabit Ethernet receiver according to one embodiment of the present disclosure. It should be noted that the gigabit Ethernet receiver 3 only exemplifies an implementation of the hybrid decoding method and is not intended to limit the scope of the present disclosure. Moreover, the gigabit Ethernet receiver 3 is for use with any gigabit Ethernet standards, to which the present disclosure is not limited.

More particularly, the gigabit Ethernet receiver 3 includes a P-tap parallel decision feedback decoder (PDFD) 30, a TCM decoder 32 and a processing circuit 34 coupled to the P-tap PDFD 30 and the TCM decoder 32. These elements can be implemented by hardware circuitry, or by hardware circuitry with firmware or with software implemented by hardware circuitry, or by hardware circuitry with firmware or with software. However, the present disclosure is not limited to the implementation of the gigabit Ethernet receiver 3. Moreover, these elements can be integrated or installed discretely, to which the present disclosure is not limited. As previously stated, the TCM decoder 32 is, for example, a Viterbi decoder, to which the present disclosure is not limited. However, since the P-tap PDFD 30 and the Viterbi decoder are known to the person with ordinary skill in the art, descriptions thereof are not presented herein.

More particularly, the gigabit Ethernet receiver 3 decodes an Ethernet data stream (not shown) using the P-tap PDFD 30 in a first pre-determined time interval to generate a plurality of first decoded sequences (not shown), and the processing circuit 34 generates a first statistic value according to a number of abnormal state transitions of the plurality of first decoded sequences and determines whether the first statistic value is larger than a first threshold value. When the first statistic value is larger than the first threshold value, the gigabit Ethernet receiver 3 decodes the Ethernet data stream using the P-tap PDFD 30 and the trellis coded modulation decoder 32 in a second pre-determined time interval after the first pre-determined time interval to generate a plurality of second decoded sequences (not shown) and a plurality of third decoded sequences (not shown), respectively, and the processing circuit 34 generates a second statistic value and a third statistic value according to a number of abnormal state transitions of the plurality of second decoded sequences and a number of abnormal state transitions of the plurality of third decoded sequences, respectively. At last, the processing circuit 34 determines an output of the P-tap PDFD 30 or the trellis coded modulation decoder 32 as a decoded result of the Ethernet data stream according to the second statistic value and the third statistic value after the second pre-determined time interval.

According to the previous teachings, the person with ordinary skill in the art should understand that one of objects of the present disclosure is to use the additional TCM decoder 32 as another decoding algorithm. When error propagation is detected and determined in a currently used main decoding algorithm (i.e., the P-tap PDFD 30), the gigabit Ethernet receiver 3 uses a TCM decoder 32 synchronously to decode the Ethernet data stream (i.e., Step S105), and determines a follow-up main decoding algorithm according to the decoded results of the P-tap PDFD 30 and the TCM decoder 32 in the same time interval to effectively prevent error propagation due to burst interference. The processing circuit 34 determines the P-tap PDFD 30 or the trellis coded modulation decoder 32 as a follow-up main decoding algorithm. Detailed operations of these elements are as described in the previous embodiment and are thus not presented herein.

On the other hand, as previously stated, the TCM decoder 32 generally provides a hard-decision mode. Therefore, the gigabit Ethernet receiver 3 may further include a hard-decision decoder (not shown) coupled to the processing circuit 34. It should be noted that the hard-decision decoder can be integrated with the TCM decoder 32 or installed separately, to which the present disclosure is not limited. When the gigabit Ethernet receiver 3 conducts the step of decoding the Ethernet data stream using the P-tap PDFD 30 and the TCM decoder 32, respectively, the gigabit Ethernet receiver 3 decodes the Ethernet data stream using the hard-decision decoder at the same time. Detailed operations of the hard-decision mode are as described in the previous embodiment and are thus not presented herein.

In summary, the present disclosure provides a hybrid decoding method and a gigabit Ethernet receiver using the same capable of detecting and determining error propagation due to burst interference in a main decoding algorithm (i.e., a P-tap PDFD), decoding an Ethernet data stream using another decoding algorithm (i.e., a TCM decoder), and determining a follow-up main decoding algorithm according to the decoded results of the two decoders in the same time interval to effectively prevent error propagation due to burst interference.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A hybrid decoding method for use in a gigabit Ethernet receiver, wherein said gigabit Ethernet receiver includes a P-tap parallel decision feedback decoder (PDFD), a trellis coded modulation (TCM) decoder and a processing circuit, said hybrid decoding method comprising the steps of:
said gigabit Ethernet receiver decoding an Ethernet data stream using said P-tap parallel decision feedback decoder (PDFD) in a first pre-determined time interval to generate a plurality of first decoded sequences, said processing circuit generating a first statistic value according to a number of abnormal state transitions of said plurality of first decoded sequences, and determining whether said first statistic value is larger than a first threshold value;
when said first statistic value is larger than said first threshold value, said gigabit Ethernet receiver decoding said Ethernet data stream using said P-tap PDFD and said trellis coded modulation (TCM) decoder in a second pre-determined time interval after said first pre-determined time interval to generate a plurality of second decoded sequences and a plurality of third decoded sequences, respectively, and said processing circuit generating a second statistic value and a third statistic value according to a number of abnormal state transitions of said plurality of second decoded sequences and a number of abnormal state transitions of said plurality of third decoded sequences, respectively; and
said processing circuit determining an output of said P-tap PDFD or said TCM decoder as a decoded result of said Ethernet data stream according to said second statistic value and said third statistic value after said second pre-determined time interval;
wherein when said first statistic value is not larger than said first threshold value, said processing circuit determines said output of said P-tap PDFD as said decoded result of said Ethernet data stream after said first pre-determined time interval;
wherein when the last digit of the present sequence is not equal to the initial digit of the next sequence, the gigabit Ethernet receiver determines there is an abnormal state transition;
wherein said number of abnormal state transitions indicates times a last digit of a present sequence is not equal to an initial digit of a next sequence in said plurality of first decoded sequences, said plurality of second decoded sequence or said plurality of third decoded sequences.

2. The hybrid decoding method of claim 1, wherein said TCM decoder is a Viterbi decoder.

3. The hybrid decoding method of claim 1, wherein the step of "said gigabit Ethernet receiver decoding said Ethernet data stream using said P-tap PDFD and said TCM decoder" further comprises the step of:
said gigabit Ethernet receiver decoding said Ethernet data stream using a hard-decision decoder.

4. The hybrid decoding method of claim 3, wherein the step of "said processing circuit determining said output of said P-tap PDFD or said TCM decoder as said decoded result of said Ethernet data stream according to said second statistic value and said third statistic value after said second pre-determined time interval" further comprises the steps of:
said processing circuit determining whether said second statistic value is larger than a second threshold value;
when said second statistic value is not larger than said second threshold value, said processing circuit determining said output of said P-tap PDFD as said decoded result of said Ethernet data stream after said second pre-determined time interval;
when said second statistic value is larger than said second threshold value, said processing circuit determining whether said third statistic value is larger than a third threshold value; and
when said third statistic value is not larger than said third threshold value, said processing circuit determining said output of said TCM decoder as said decoded result of said Ethernet data stream after said second pre-determined time interval, and switching to determine said output of said P-tap PDFD as said decoded result of said Ethernet data stream when said decoded result of said Ethernet data stream conforms to a start-of-stream delimiter.

5. The hybrid decoding method of claim 4, further comprising, after "said processing circuit determining whether said third statistic value is larger than said third threshold value", the step of:
when said third statistic value is larger than said third threshold value, said processing circuit determining an output of said hard-decision decoder as said decoded result of said Ethernet data stream after said second pre-determined time interval, and switching to determine said output of said P-tap PDFD as said decoded result of said Ethernet data stream when said decoded result of said Ethernet data stream conforms to said start-of-stream delimiter.

6. The hybrid decoding method of claim 5, wherein the step of "said processing circuit determining said output of said TCM decoder as said decoded result of said Ethernet data stream" further comprises the steps of:
said processing circuit determining whether said decoded result of said Ethernet data stream conforms to an end-of-stream delimiter or an idle; and
when said decoded result of said Ethernet data stream conforms to said end-of-stream delimiter or said idle, said processing circuit determining said output of said hard-decision decoder as said decoded result of said Ethernet data stream.

7. A gigabit Ethernet receiver, comprising:
a P-tap parallel decision feedback decoder (PDFD);
a trellis coded modulation (TCM) decoder; and
a processing circuit, coupled to said P-tap PDFD and said TCM decoder, wherein,
said gigabit Ethernet receiver decodes an Ethernet data stream using said P-tap PDFD in a first pre-determined time interval to generate a plurality of first decoded sequences, and said processing circuit generates a first statistic value according to a number of abnormal state transitions of said plurality of first decoded sequences and determines whether said first statistic value is larger than a first threshold value;
when said first statistic value is larger than said first threshold value, said P-tap PDFD and said TCM decoder decode said Ethernet data stream in a second pre-determined time interval after said first pre-determined time interval to generate a plurality of second decoded sequences and a plurality of third decoded sequences, respectively, and said processing circuit generates a second statistic value and a third statistic value according to a number of abnormal state transitions of said plurality of second decoded sequences and a number of abnormal state transitions of said plurality of third decoded sequences, respectively; and
said processing circuit determines an output of said P-tap PDFD or said TCM decoder as a decoded result of said Ethernet data stream according to said second statistic value and said third statistic value after said second pre-determined time interval;
wherein when said first statistic value is not larger than said first threshold value, said processing circuit determines said output of said P-tap PDFD as said decoded result of said Ethernet data stream after said first pre-determined time interval;
wherein when the last digit of the present sequence is not equal to the initial digit of the next sequence, the gigabit Ethernet receiver determines there is an abnormal state transition;
wherein said number of abnormal state transitions indicates times a last digit of a present sequence is not equal to an initial digit of a next sequence or said plurality of first decoded sequences, said plurality of second decoded sequences or said plurality of third decoded sequences.

8. The gigabit Ethernet receiver of claim 7, wherein said TCM decoder is a Viterbi decoder.

9. The gigabit Ethernet receiver of claim 7, wherein said gigabit Ethernet receiver further comprises a hard-decision decoder coupled to said processing circuit, and said gigabit Ethernet receiver uses said hard-decision decoder to decode said Ethernet data stream.

10. The gigabit Ethernet receiver of claim 9, wherein
said processing circuit determines whether said second statistic value is larger than a second threshold value;
when said second statistic value is not larger than said second threshold value, said processing circuit determines said output of said P-tap PDFD as said decoded result of said Ethernet data stream after said second pre-determined time interval;
when said second statistic value is larger than said second threshold value, said processing circuit determines whether said third statistic value is larger than a third threshold value; and
when said third statistic value is not larger than said third threshold value, said processing circuit determines said output of said TCM decoder as said decoded result of said Ethernet data stream after said second pre-determined time interval, and switches to determine said output of said P-tap PDFD as said decoded result of said Ethernet data stream when said decoded result of said Ethernet data stream conforms to a start-of-stream delimiter.

11. The gigabit Ethernet receiver of claim 10, wherein, when said third statistic value is larger than said third threshold value, said processing circuit determines an output of said hard-decision decoder as said decoded result of said Ethernet data stream after said second pre-determined time interval, and switches to determine said output of said P-tap PDFD as said decoded result of said Ethernet data stream when said decoded result of said Ethernet data stream conforms to said start-of-stream delimiter.

12. The gigabit Ethernet receiver of claim 11, wherein said processing circuit determines whether said decoded result of said Ethernet data stream conforms to an end-of-stream delimiter or an idle; and
when said decoded result of said Ethernet data stream conforms to said end-of-stream delimiter or said idle, determines said output of said hard-decision decoder as said decoded result of said Ethernet data stream.

* * * * *